United States Patent
Fok et al.

(10) Patent No.: US 8,103,266 B2
(45) Date of Patent: Jan. 24, 2012

(54) APPARATUS AND METHODS FOR MANAGING BATTERY PERFORMANCE OF A WIRELESS DEVICE

(75) Inventors: Kenny Fok, San Diego, CA (US); Tia Manning Cassett, San Diego, CA (US); Jihyun Hwang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 349 days.

(21) Appl. No.: 11/251,297

(22) Filed: Oct. 14, 2005

(65) Prior Publication Data
US 2006/0217152 A1 Sep. 28, 2006

Related U.S. Application Data

(60) Provisional application No. 60/665,435, filed on Mar. 25, 2005.

(51) Int. Cl.
*H04W 24/00* (2009.01)
(52) U.S. Cl. .......... 455/423; 455/67.11; 455/115.1; 455/419
(58) Field of Classification Search .......... 455/572–574, 455/423, 67.11, 115.1, 425, 424
See application file for complete search history.

(56) References Cited

U.S. PATENT DOCUMENTS

| | | | |
|---|---|---|---|
| 5,870,685 A | 2/1999 | Flynn | |
| 6,169,883 B1 * | 1/2001 | Vimpari et al. | 455/67.11 |
| 6,238,188 B1 | 5/2001 | Lifson | |
| 6,390,779 B1 | 5/2002 | Cunkelman | |
| 6,456,036 B1 * | 9/2002 | Thandiwe | 320/106 |
| 7,010,329 B2 * | 3/2006 | Livet et al. | 455/574 |
| 7,024,161 B1 * | 4/2006 | LaMedica, Jr. | 455/67.11 |
| 7,222,031 B2 * | 5/2007 | Heatley | 702/63 |
| 2002/0177475 A1 | 11/2002 | Park | |
| 2004/0058652 A1 * | 3/2004 | McGregor et al. | 455/67.13 |
| 2004/0180701 A1 | 9/2004 | Livet et al. | |
| 2004/0203719 A1 * | 10/2004 | Ross et al. | 455/423 |
| 2004/0207405 A1 | 10/2004 | Yang | |

FOREIGN PATENT DOCUMENTS

| | | |
|---|---|---|
| EP | 1 261 064 A1 | 11/2002 |
| EP | 1 524 829 A1 | 4/2005 |
| TW | 302586 | 4/1997 |

OTHER PUBLICATIONS

International Search Report and Written Opinion—PCT/US2006/010956, International Search Authority—European Patent Office—Jul. 26, 2006.
Taiwanese Search Report—095110436—TIPO—Jun. 21, 2010.

* cited by examiner

*Primary Examiner* — Vladimir Magloire
(74) *Attorney, Agent, or Firm* — Stanton Braden

(57) ABSTRACT

Apparatus, methods, and programs that determine and manage battery performance characteristics of a wireless device. Embodiments include a wireless device having a computer platform with a processing engine operable to generate a plurality of battery performance data associated with activities on the wireless device. The wireless device further includes a battery performance module operable, based on a received battery performance configuration, to collect selected ones of the plurality of battery performance data. The embodiments may also include an apparatus operable to generate the battery performance configuration, and operable to receive the collected battery performance data and to generate a performance report characterizing the battery performance of the wireless device. Further, embodiments of the apparatus may also generate and transmit to the wireless device a new device operational configuration, based on the collected battery performance data, effective to change the battery performance of the wireless device.

50 Claims, 5 Drawing Sheets

APPARATUS AND METHODS FOR MANAGING BATTERY PERFORMANCE OF A WIRELESS DEVICE

CLAIM OF PRIORITY UNDER 35 U.S.C. §119

The present application for patent claims priority to Provisional Application No. 60/665,435 entitled "Methods And Apparatus For Providing Battery Performance Information In A Wireless Device," filed Mar. 25, 2005, assigned to the assignee hereof and hereby expressly incorporated by reference herein.

BACKGROUND

The described embodiments generally relate to wireless communications devices and computer networks. More particularly, the described embodiments relate to apparatus and methods for determining battery performance characteristics of a wireless device, along with the collection, reporting and analysis of battery performance data from the wireless device.

Wireless networking connects one or more wireless devices to other computer devices without a direct electrical connection, such as a copper wire or optical cable. Wireless devices communicate data, typically in the form of packets, across a wireless or partially wireless computer network and open a "data" or "communication" channel on the network such that the device can send and receive data packets. The wireless devices often have wireless device resources, such as programs and hardware components, which individually and cooperatively operate to use and generate data in accordance to their design and specific protocol or configuration, such as using open communication connections to transmit and receive data on the network.

The battery performance in these wireless devices is critical for their portability. The battery must not only provide hours of service, but also normally must be rechargeable. Further, the wireless network services providers and/or the manufacturer of the wireless devices often make claims and/or warranties relating to the battery performance, e.g. a network service provider may claim that a particular wireless device has seventy (70) hours of idle time or nine (9) hours of talk time. The wireless network services providers also have a strong incentive for the performance of the batteries to be optimum so that their customers can purchase services from them. Problems with battery performance are particularly exacerbated because there may be millions of units of a particular wireless device or component in use, and because people have become so dependent on wireless devices that they demand that the device be immediately repaired. Thus, the wireless network service providers would like to monitor battery performance to insure that the battery performance of the wireless device is within the promised standards, and further the wireless service providers would like to be able to quickly diagnose and repair substandard battery performance.

Wireless devices have become increasingly complex being manufactured with increased computing capabilities. Wireless devices have many components and operations that can affect the battery performance. For example, the following all affect battery performance: displays, transmitting data, game programs, synchronizing contact lists over an additional protocol like Bluetooth®, etc. Further, the wireless devices often have many accessories that can affect the performance of the battery, such as chargers, digital cameras, computer docking ports, etc. With this great complexity, it can be both difficult and expensive to predict the performance of the battery and to trouble-shoot substandard battery performance.

In order for the battery performance of the wireless device to operate efficiently and optimally, and in order to diagnose battery performance problems it would be useful for the data associated with the battery performance to be collected and reported, and for the characteristics of the battery to be calculated with the use of predetermined battery standards.

Accordingly, it would be advantageous to provide an apparatus and method that allows for efficient, comprehensive collection and reporting of wireless device battery performance data.

BRIEF SUMMARY

The described embodiments comprise apparatus, methods, and programs for battery performance measurement, collection and reporting on a wireless device.

In one embodiment, an apparatus for determining performance of a battery, comprises a battery performance module operable to generate a battery tracking configuration for execution by a wireless device. The battery tracking configuration defines types of battery performance data to retrieve from a computer platform of the wireless device. Further, the apparatus comprises a data log operable to receive and store the battery performance data collected from the computer platform of the wireless device, wherein the collected battery performance data are indicative of a battery performance characteristic.

In another embodiment, an apparatus for determining battery performance of a battery disposed on a wireless device comprises a generator means for generating and transmitting a battery tracking configuration across a wireless network to a wireless device. The battery tracking configuration defines a type of battery performance data to retrieve from a computer platform of the wireless device. The apparatus further comprises a storing means for receiving and storing battery performance data collected from the computer platform of the wireless device based on the battery tracking configuration. Additionally, the apparatus comprises an analysis means for analyzing the collected battery performance data and generating a battery performance report.

In yet another embodiment, a wireless communications device comprises a computer platform having a battery performance module operable to log battery performance data based on a battery tracking configuration.

In a further embodiment, a wireless device comprises a means disposed on the wireless device for tracking battery performance data, a means for collecting the battery performance data, wherein the battery performance data is based on a battery tracking configuration, and a means for selectively transmitting the collected battery performance data across the wireless network.

In still another embodiment, a device for managing battery performance of a wireless communications device comprises a data log module for receiving battery performance data corresponding to a processing of a battery tracking configuration on the wireless communications device. Further, the device comprises a performance analyzer module for analyzing the battery performance data and generating a battery performance report having a battery performance characteristic.

In yet another embodiment, a method of managing battery performance of a wireless device comprises generating a battery tracking configuration executable by the wireless device to log predetermined battery performance data, and transmitting the battery tracking configuration to the wireless device. The method further comprises receiving a data log comprising the battery performance data from the wireless device, where the battery performance data are based on the battery tracking configuration. Additionally, the method comprises generating a battery performance report based on the battery performance data. In a related embodiment, a computer program is resident in a computer readable medium that, when executed, directs a computer device to perform the actions of the above method. Similarly, in another embodiment, at least one processor is configured to perform the above-stated actions.

In another embodiment, a method of managing battery performance of a wireless device comprises receiving a battery tracking configuration and collecting selected battery performance data based on the battery performance tracking configuration. The method also comprises transmitting to another device the collected battery performance data based on the battery performance tracking configuration, where the collected battery performance data defines a battery performance characteristic. In a related embodiment, a computer program is resident in a computer readable medium that, when executed, directs a computer device to perform the actions of the above method. Similarly, in another embodiment, at least one processor is configured to perform the above-stated actions.

Additional aspects and advantages of the disclosed embodiments are set forth in part in the description which follows, and in part are obvious from the description, or may be learned by practice of the disclosed embodiments. The aspects and advantages of the disclosed embodiments may also be realized and attained by the means of the instrumentalities and combinations particularly pointed out in the appended claims.

BRIEF DESCRIPTION OF THE DRAWINGS

The disclosed embodiments will hereinafter be described in conjunction with the appended drawings provided to illustrate and not to limit the disclosed embodiments, wherein like designations denote like elements, and in which.

DETAILED DESCRIPTION

Figure 1:
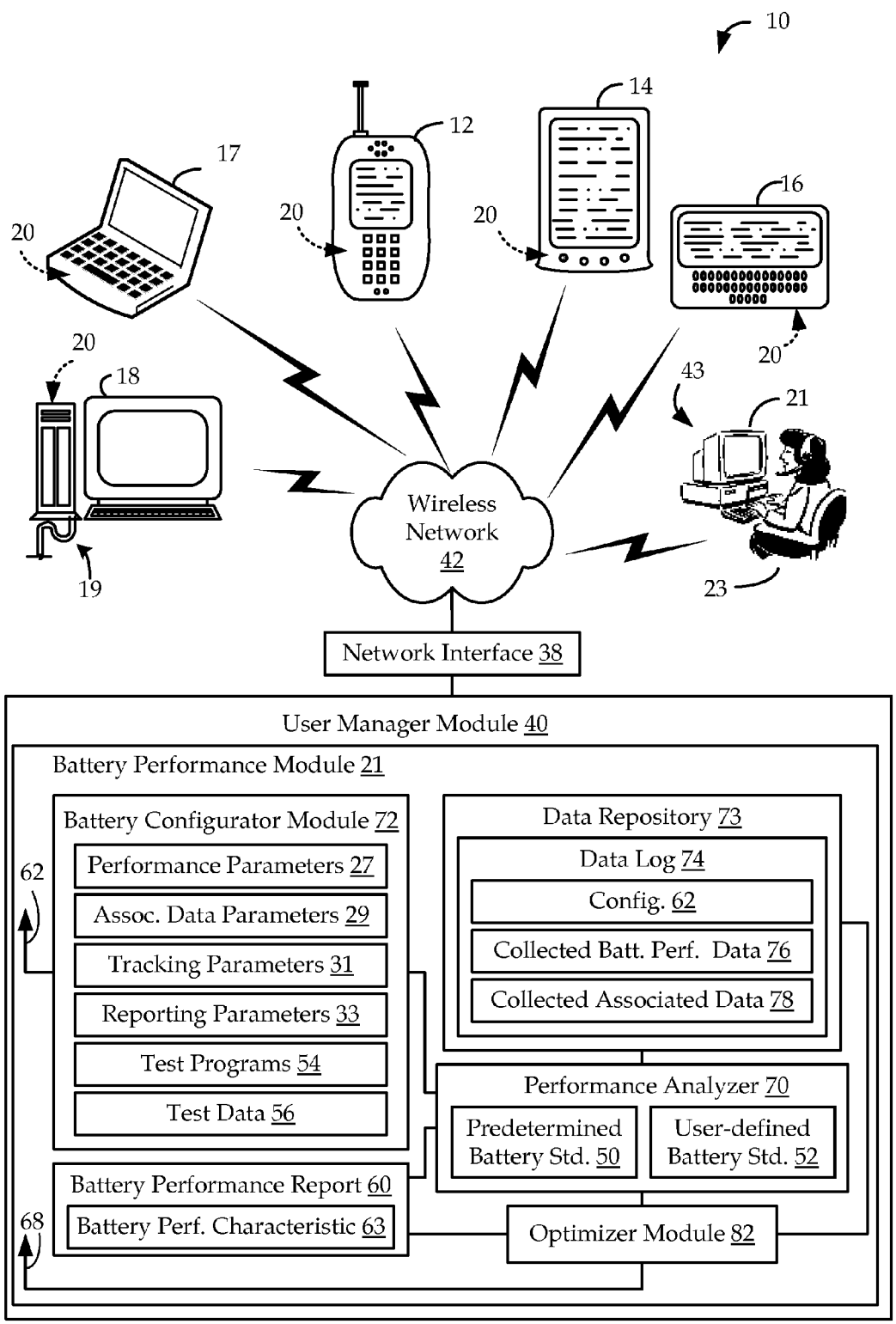
FIG. 1 is a representative diagram of one embodiment of an apparatus for determining a battery characteristic of a wireless device.
Figure 2:
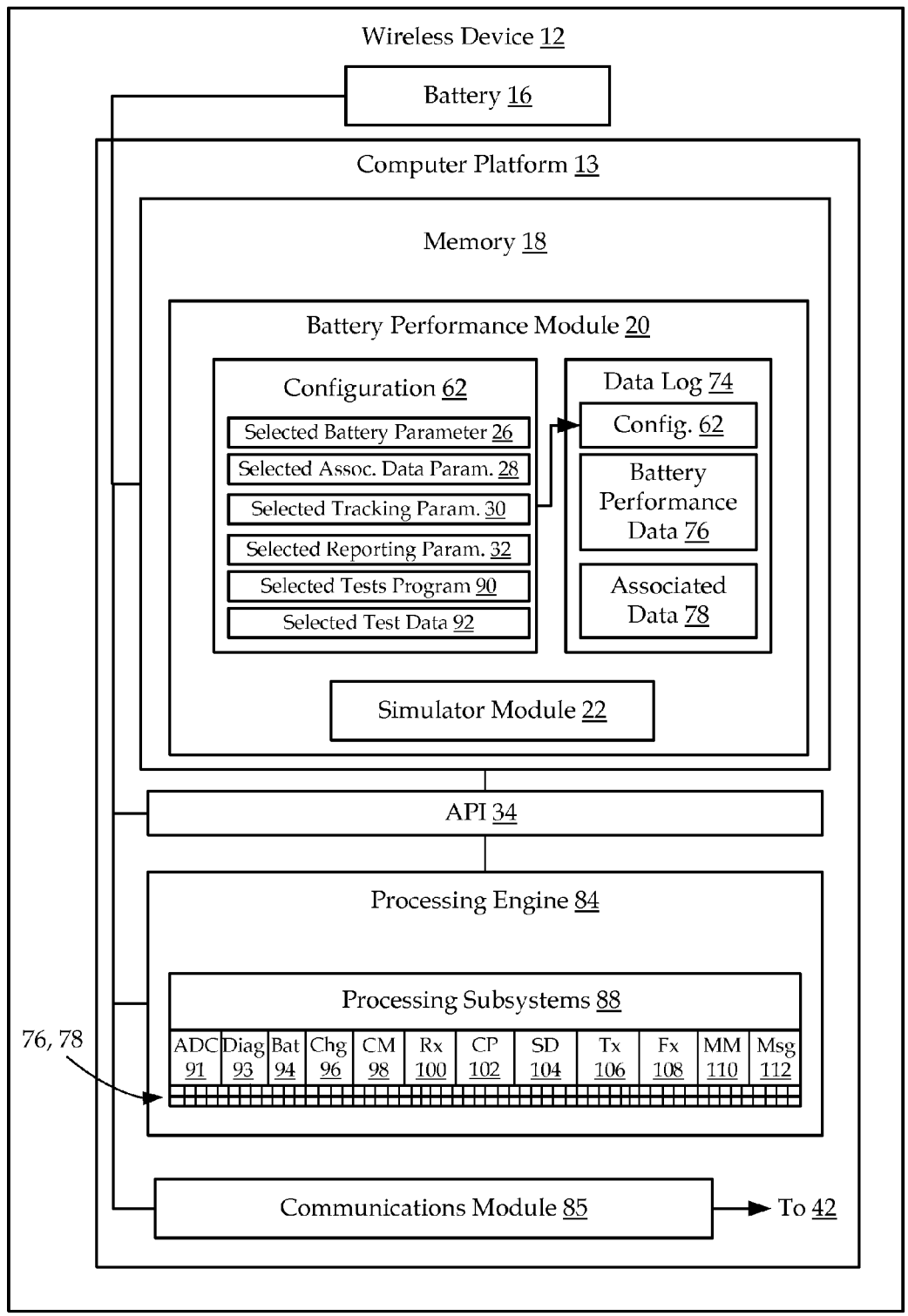
FIG. 2 is one embodiment of an architecture diagram of the interaction between a battery performance module and a processing engine of the wireless device of FIG. 1.

Referring to FIGS. 1 and 2, one embodiment of a system 10 for collecting battery performance data and analyzing the battery performance characteristics of any one of a plurality of wireless devices 12, 14, 16, 17, 18 in communication with a wireless network 42 includes a resident battery performance module 20 on each device. Each resident battery performance module 20 is operable, according to configuration 62 defined by a battery configurator module 72, which may be remotely located, to collect and transmit selected ones of a plurality of types of battery performance data 76 and associated data 78 across a wireless network 42 to a user manager module 40. For example, battery configurator module 72 dictates what types of battery performance data 76 and associated data 78 to collect, how often to collect the data, and when to report the collected data. Further, battery configurator module 72 may dictate one of a plurality of predetermined test programs 54 and/or test data 56 to execute on the respective wireless device 12, 14, 16, 17, 18 in order to generate the battery performance data 76 and the associated data 78 to collect. User manager module 40 stores the transmitted battery performance data 76 and associated data 78, which may be held in a data log 74 along with tracking configuration 62, in a data repository 73 which is accessible by a performance analyzer 70. Performance analyzer 70 examines the collected battery performance data 76 and associated data 78 and generates a battery performance report 60 that characterizes one or more actual battery performance characteristics 63 associated with the respective device 12, 14, 16, 17, 18 based on the collected battery performance data 76 and associated data 78. In one embodiment, the collected battery performance data 76 and associated data 78 are compared with predetermined battery standards 50 and/or user-defined battery standards 52. For example, the performance analyzer 70 may compare a selected portion of the actual battery performance data 76, such as the maximum voltage of the battery, to a selected portion of the predetermined battery standards 50, such as the maximum voltage a battery of this type should reach, and using this comparison, derives a battery performance characteristic 63 for battery 16. Further, after performing an initial analysis on an initial set of battery performance data 76, performance analyzer 70 may initiate further communications with one or more wireless devices 12, 14, 16, 17, 18 to retrieve additional battery performance data 76 and associated data 78. Performance analyzer 70 may repeat such a feedback loop until a predetermined solution is achieved, i.e. until the performance analyzer 70 determines there is enough battery performance data 76 and associated data 78 to determine a battery performance characteristics 63.

Optionally, user manager module 40 may include an optimization module 82 that analyzes data log 74 and/or battery performance report 60 and generates new configuration settings 68 for a respective wireless to improve battery performance. User manager module 40 may then transfer the updated device configuration settings 68 to the respective wireless device in order to improve the battery performance of the respective wireless device 12, 14, 16, 17, 18. Examples of a new configuration setting 68 would be lowering the amps used to transmit, or turning off the light on the display more quickly after use. Further, battery performance module 40 may transmit at least a portion of data log 74 and/or battery performance report 60 to either the user of the respective wireless device 12, 14, 16, 17, 18 or to another device or entity 43. For example, battery performance report 60 may be sent to a technician, a customer service representative, a carrier, and any third party who may be interested in battery performance information. In an example of report 60 being sent to a network operator module 43, the network operator module 43 may then take further action, such as generating a command for a new battery to be sent to the user of the respective wireless device 12, 14, 16, 17, 18, or issuing further commands to user manager module 40 to conduct further tests on the respective wireless device 12, 14, 16, 17, 18 or other wireless devices 12, 14, 16, 17, 18.

Thus, the present apparatus and methods provide for the collection, analysis, and reporting of predetermined battery performance data 76 and associated data 78 associated with the battery performance capabilities of a wireless device 12, 14, 16, 17, 18, and allow for troubleshooting and optimization of battery performance related device configuration in order to improve the battery performance of the respective wireless device 12, 14, 16, 17, 18.

Battery performance data 76 can include any type of operational-related data associated with the battery or power supply of a wireless device 12, 14, 16, 17, 18. Battery performance data 76 includes, but is not limited to: battery identification; battery voltage; charging source; charging voltage; charging current; call time; analog or digital protocol used; protocol type, such as IS-95, CDMA-1x, and, UMTS; sleep time; low power mode information; battery temperature; change in battery voltage for each minute of talk time; and (referring to FIG. 2) any battery-related operational data that can be generated from processing engine 84 during actual operation of the wireless device 12, 14, 16, 17, 18. Associated data 78 can include any type of data, such as the operational or environmental conditions of the respective device and/or network corresponding to the collected battery performance data 76. Associated data 78 includes, but is not limited to: current operation of the wireless device 12, 14, 16, 17, 18; timestamps; corresponding application information; corresponding protocol information; subsystem information related to battery performance data 76; and, any data that can be generated from processing engine 84 during actual operation of the wireless device 12, 14, 16, 17, 18 which is related to, or which can be associated with, battery performance data 76.

Battery performance module 20 may be initiated at any time, and battery performance data 76 and associated data 78 may be stored on the respective wireless device 12, 14, 16, 17, 18 and obtained at any time via a wired or wireless connection to the respective wireless device. Battery performance module 20 may include any hardware, software, firmware and/or other set of executable instructions operable to manage the collection on the wireless device, and transmission across the wireless network, of any information relating to the battery performance capabilities of the respective wireless device. Battery performance module 20 collects any battery related battery performance data 76 along with associated data 78 relevant to battery performance data 76. Further, battery performance module 20 may store this information in a data log 74, either in a resident memory or another memory/storage device connectable to the respective wireless device. Further, data log 74 may include the details of tracking/reporting configuration 62 in data log 74 in associated with the collected data. In one embodiment, for example, battery performance module 20 comprises performance data management logic 35, which includes executable instructions for managing receiving and executing configuration 62, collecting and storing battery performance data 76 and/or associated data 78, and providing access to or forwarding log 74 and/or its contents for further analysis. Thus, in one embodiment, battery performance module 20 provides each wireless device 12, 14, 16, 17, 18 with a resident or self-contained capability for retrieving and recording battery performance data 76 and associated data 78 associated with battery related activities on a wireless device, as well as for allowing the transmission and remote analysis of such battery performance data 76 and associated data 78.

Battery performance module 20 may cause the respective wireless device to selectively transmit battery performance data 76, such as battery voltage, for that wireless device 12, 14, 16, 17, 18 to another computer device, such as user manager module 40, on the wireless network 42. In one embodiment, battery performance module 20 transmits battery performance data 76 and associated data 78 from that wireless device 12, 14, 16, 17, 18 to user manager 40 across the wireless network 42. Alternatively, battery performance data 76 and associated data 78 is transmitted over an open communication connection from the wireless device 12, 14, 16, 17, 18 to the wireless network 42, and thus "piggybacked" across an open connection, such as a voice or data call at the cellular telephone 12. In a cellular network configuration, battery performance data 76 and associated data 78, can be transmitted to user manager module 40 through short message service. In another embodiment, a remote user manager module 40 reads battery performance data 76 from the respective device through the resident battery performance module 20, and in some instances, writes commands to computer platform 13 and alters the operation of the wireless device 12, 14, 16, 17, 18. Accordingly, the access to battery performance module 20 allows the user manager module 40 to remotely control parameters for battery performance data collection, then analyze, and report battery performance characteristics.

User manager 40 may communicate with wireless devices 12, 14, 16, 17, 18 through a direct, wired connection or through a wireless connection, such as through a network interface 38 in communication with wireless network 42. The communication between user manager module 40 and wireless device 12, 14, 16, 17, 18 may include downloads of all, or selected portions (such as data sets), of resident battery performance module 20 that operates within wireless device 12, 14, 16, 17, 18. Other such communications include uploads from each wireless device 12, 14, 16, 17, 18 back to the user manager 40, such as uploads of battery performance data 76, or uploads of battery performance module 20.

User manager module 40 may be at least one of any type of server, personal computer, mini computer, mainframe computer, or any computing device either special purpose or general computing device. Further, user manager module 40 may reside entirely on the wireless device 12, 14, 16, 17, 18. Further, there can be separate servers or computer devices associated with user manager module 40 that work in concert to provide data in usable formats to parties, and/or a separate layer of control in the data flow between the wireless devices 12, 14, 16, 17, 18 and user manager module 40. User manager module 40 (or plurality of modules) can send software agents or applications, such as the resident battery performance module 20, to wireless devices 12, 14, 16, 17, 18 across wireless network 42, such that the respective wireless devices return data from their resident applications and subsystems. For example, wireless devices 12, 14, 16, 17, 18 may transmit data, such as performance data 76, to user manager module 40 or some other computer device on the network in the form of a data log 74. Data log 74 includes the battery performance data 76, as collected based on the configuration received from battery configurator module 72, and also may include other associated data 78. User manager module 40 utilizes data log 74 for analyzing and reporting the battery performance of the respective device, including but not limited to: call time, idle time, battery charger performance, and any battery related characteristic of a wireless device.

User manager module 40 and its corresponding components can give a ready view of data log 74 collected from the wireless devices in any form, such as tables, maps, graphics views, plain text, interactive programs or web pages, or any other display or presentation of the data. For example, user manager module 40 may present data log 74 and/or battery performance report 60 on a monitor or display device, and/or may transmit, such as via electronic mail, this information to another computer device for further analysis or review. Also, user manager module 40 may change an operation parameter and/or configuration setting of a respective wireless device, based on data log 74 and/or based on the results of the performance analyzer 70.

User manager 40 includes remote battery performance module 21 to manage battery performance-related operations. Remote battery performance module 21 may include software, hardware, firmware, and generally any executable instructions operable by user manager module 40. In one embodiment, for example, remote battery performance module 21 comprises data management logic 25, which includes executable instructions for managing generating and transmitting configuration 62, collecting and storing battery performance data 76 and/or associated data 78, and initiating the analysis and optimizations procedures described herein. Remote battery performance module 21 may download all or a portion of the resident version of battery performance module 20 to each wireless device 12, 14, 16, 17, 18. Alternatively, the resident version of battery performance module 20 may be loaded onto the respective wireless device during the initial assembly process or via direct connections during a configuration process. Further, remote battery performance module 21 is executable by user manager module 40 to generate battery performance-tracking configuration 62 and to manage the collection of data logs 74 from wireless devices 12, 14, 16, 17, 18. Remote battery performance module 21 may "pull" the logs 74 based on commands from a user, or the logs may be "pushed" from the respective devices at predetermined times or upon reaching predetermined memory/data storage levels or upon reaching predetermined conditions such as the wireless device providing talk time below a predetermined battery standard 50.

Remote battery performance module 21 includes battery configurator module 72 that includes hardware, firmware, software and/or any other associated logic that allows a user to generate battery performance tracking configuration 62. Configurator module 72 allows the selection of the exact tracking configuration 62 from at least one of a plurality of battery performance parameters 27, a plurality of associated data parameters 29, a plurality of tracking parameters 31, a plurality of reporting parameters 33, the plurality of test programs 54, and the plurality of test data 56. The plurality of battery performance parameters 27 correspond to categories or types of battery performance data stored on the respective wireless device. The plurality of associated data parameters 29 correspond to categories or types of other data stored on the respective wireless device and related to battery performance data. The plurality of tracking parameters 31 correspond to settings defining when and/or how to log battery performance parameters and/or associated data parameters. The plurality of reporting parameters 33 correspond to settings defining when, where and/or how to transmit the logged data. The plurality of test programs 54 define various tests or simulations to perform on the respective wireless device to test a predefined characteristic of battery performance. The plurality of test data 56 define various data to be executed by the respective wireless device to test a predefined characteristic of battery performance. As such, configurator module 72 is operable to execute to generate tracking configuration 62 that comprises at least one of, or any combination of, a selected battery performance parameter 26, a selected associated data parameter 28, a selected tracking parameter 30, a selected reporting parameter 32, a selected test program 90 and a selected test data 92 (see FIG. 2). Once configuration 62 is determined, configurator module 72 and/or battery performance module 21 is operable to transmit tracking configuration 62 to one or more wireless devices to initiate the tracking and management of battery performance on that device. Further, the various components/parameters of tracking configuration 62 may be individually-selected by a user, or the user may select from predefined sets or groups of parameters that may be associated with a given battery performance characteristic.

For example, the plurality of battery performance parameters 27 include but are not limited to: battery identification, battery voltage, battery current, battery temperature, charging status (e.g. currently charging or not charging), charging source (e.g. wall outlet, automobile charger, USB charger, etc.), charging voltage, charging current, charging time, and any battery performance-related data that can be collected by the processing engine 84. The plurality of associated data parameters 29 include but are not limited to: slot cycle index, call time, analog call, digital call, call protocol, sleep/idle time, low power mode information, etc. The plurality of tracking parameters 31 include but are not limited to: collecting parameters associated with battery parameters 26 and associated data 78, such as a frequency, i.e. every one (1) second, an event, i.e. collecting the data every time the battery voltage falls below some predetermined voltage, and any tracking configuration that could be executed by processing engine 84 or more generally the wireless device 12, 14, 16, 17, 18. The plurality of reporting parameters 33 include but are not limited to: parameters that control transmitting the data log 74 from the respective wireless device, such as after some predetermined time, i.e. once a day, when the data log 74 has reached some predetermined size, after some predetermined event has occurred such as the wireless device has been plugged into a charger, and any type of reporting that could be executed by processing engine 84 or more generally wireless devices 12, 14, 16, 17, 18. This reporting may include only reporting portions of the data log 74. The plurality of test programs 54 and the plurality of test data 56 may include instructions or scripts executable to operate any functionality of the respective wireless device 12, 14, 16, 17, 18. The plurality of test programs 54 and the plurality of test data 56 thereby allow for battery performance testing of the respective wireless device, and/or for generation the data specified in configuration 62. Examples of the plurality of test programs 54 and/or test data 56 include, but are not limited to, one or more of operating the user interface, transmitting and/or receiving a voice call, transmitting and/or receiving a data call (e.g. including text messaging, email, photo and multimedia, and group communications), operating position/location modules, accessing the Internet, running an application, etc.

User manager 40 and/or battery performance module 21 further include performance analyzer 70 to analyze data log 74, collected based on configuration 62, received from the respective wireless device. Performance analyzer 70 may include hardware, software, firmware, and combinations thereof for analyzing and processing data log 74. Additionally, in one embodiment, performance analyzer 70 may further include analysis logic 75 which comprises algorithms, decision-making routines, statistical programs, etc. for analyzing and interpreting data log 74. Although illustrated as being associated with user manger module 40, performance analyzer 70 may be located anywhere in communication with wireless network 42, such as on user manager module 40, another server connected to the network, on a respective wireless device 12, 14, 16, 17, 18, or on a wireless network help computer 21.

As noted above, performance analyzer 70, outputs battery performance report 60, which in one embodiment may be details of battery performance data 76 and associated data 78 that are reviewed manually, such as by a technician, field engineer, wireless network help representative 23, or the user of the wireless device, for evaluation of battery processing operation-related issues associated with a particular device. In this case, a wireless network help representative 23, or the user of the wireless device, instead of or in cooperation with optimizer module 82, may generate new data processing configuration settings 68 for the respective wireless device 12, 14, 16, 17, 18 based on the collected battery performance data 76. Generally, data log 74 and battery performance report 60 may be useful in trouble-shooting battery device operation issues and identifying problem areas and/or devices, such as through analysis of data log 74 and the collected battery performance data 76 and associated data 78. As such, battery performance report 60 includes any form of output that represents analysis of battery performance data 60, as well as any other associated data 78 such as network data and wireless device data, associated with the data log 74 of one or more respective wireless device.

Additionally, as mentioned above, optimizer module 82 may access battery performance data 76 and associated data 78 directly from either battery performance report 60 or performance analyzer 70 and apply predetermined algorithms or programs to optimize the settings of one or more device and/or network-related configurations to improve the battery performance, such as talk time, idle time, etc. Optimization module 82 may include any hardware, software, firmware and/or other set of executable instructions operable to analyze battery performance data 76 and associated data 78, and determine revised network-specific and/or wireless device-specific configuration setting changes to improve battery performance.

Additionally, performance analyzer 70 may be operable to initiate further communications with a respective wireless device 12, 14, 16, 17, 18 to retrieve additional battery related data relevant to battery performance associated with data log 74, in order to perform further analysis and optimization. The optimizations performed by optimization module 82 may also be performed all or in part by the wireless network help representative 23 or user of the wireless device by manually reviewing the data log 74 or battery performance report 60, and any associated battery data 78.

Wireless network 42 includes any communications network operable, at least in part, for enabling wireless communications between a respective wireless device 12, 14, 16, 17, 18 and any other device connected to wireless network 42. Further, wireless network 42 may include all network components, and all connected devices that form the network. For example, wireless network 42 may include at least one, or any combination, of: a cellular telephone network; a terrestrial telephone network; a satellite telephone network; an infrared network such as an Infrared Data Association ("IrDA")-based network; a short-range wireless network; a Bluetooth® technology network; a ZigBee® protocol network; an ultra wide band ("UWB") protocol network; a home radio frequency ("HomeRF") network; a shared wireless access protocol ("SWAP") network; a wideband network, such as a wireless Ethernet compatibility alliance ("WECA") network, a wireless fidelity alliance ("Wi-Fi Alliance") network, and a 802.11 network; a public switched telephone network; a public heterogeneous communications network, such as the Internet; a private communications network; and land mobile radio network. Suitable examples of telephone networks include at least one, or any combination, of analog and digital networks/technologies, such as: code division multiple access ("CDMA"), wideband code division multiple access ("WCDMA"), universal mobile telecommunications system ("UMTS"), advanced mobile phone service ("AMPS"), time division multiple access ("TDMA"), frequency division multiple access ("FDMA"), orthogonal frequency division multiple access ("OFDMA"), global system for mobile communications ("GSM"), single carrier ("1X") radio transmission technology ("RTT"), evolution data only ("EV-DO") technology, general packet radio service ("GPRS"), enhanced data GSM environment ("EDGE"), high speed downlink data packet access ("HSPDA"), analog and digital satellite systems, and any other technologies/protocols that may be used in at least one of a wireless communications network and a data communications network.

Network interface 38 may be any mechanism that allows user manager module 40 to communicate across wireless network 42. For example, network interface 38 may include a local area network that connects user manager module 40 through an Internet Service Provider to the Internet, which in turn may be connected to a respected wireless device through a carrier network and a base station.

Wireless devices 12, 14, 16, 17, 18 can include any type of computerized, wireless devices, such as cellular telephone 12, personal digital assistant 14, two-way text pager 16, portable computer 17, and even a separate computer platform 18 that has a wireless communications portal, and which also may have a wired connection 19 to a network or the Internet. The wireless device can be a remote-slave, or other device that does not have an end-user thereof but simply communicates data across the wireless network 42, such as remote sensors, diagnostic tools, data relays, and the like. The apparatus and method of battery performance measurement, collecting and reporting on the wireless device can accordingly be performed on any form of wireless device or computer module, including a wired or wireless communication portal, including without limitation, wireless modems, PCMCIA cards, access terminals, personal computers, telephones, or any combination or sub-combination thereof.

Referring again to FIG. 2, in one embodiment, computer platform 13 includes battery performance module 20 that interfaces with application program interface ("API") 34 and is executable by a processing engine 84. In one embodiment, user manager module 40 (FIG. 1) can "push" at least one battery performance module 20 to be resident, at least temporarily, on the computer platform 13 of each wireless device 12, 14, 16, 17, 18. For example, user manager module 40 may "push" battery performance module 20 across wireless network 42 to the respective devices. Alternatively, battery performance module 20 can be placed on the computer platform 13 at the time of manufacture or initial programming, or the wireless device 12, 14, 16, 17, 18 can "pull" the application from another computer device on the network, such as user manager module 40, either with a request from the end-user, or automatically. User manager module 40 may then transmit configuration 62 to battery performance module 20 to collect battery performance data 76 and associated data 78. Further, battery performance module 20 can be permanently stored in the local storage 80 (referring to FIG. 3) of the wireless device computer platform 13, or can only be temporarily held in memory 18 thereof for a one time (or n-time, where n is a positive integer) execution to transmit battery performance data 76 along with associated data 78.

Processing engine 84 includes various processing subsystems 88 embodied in hardware, firmware, software, and combinations thereof, that enable the functionality of the respective wireless device 12, 14, 16, 17, 18 and the operability of the respective device on wireless network 42, such as for connecting with the network, exchanging data/communications with other devices, etc. For example, processing engine 84 may include, one or a combination of processing subsystems 88, such as: sound, non-volatile memory, file system, transmit, receive, searcher, physical layer, link layer, call processing layer, main control, remote procedure, music, audio, handset, power management, diagnostic, digital signal processor, vocoder, messaging, call manager, Bluetooth® LOPS, position determination, position engine, user interface, sleep, data services, security, authentication, USIM/SIM, voice services, graphics, USB, video services, camera/camcorder interface and associated display drivers, multimedia such as MPEG, GPRS, etc., along with other functionality applications. In one embodiment, API 34 includes a class of software extensions that allow battery performance module 20 to access processing engine 84. These software extensions can communicate with processing subsystems 88 on the wireless device, which allows both data reads and commands. For example, this software extension can send commands, including sending SMS messages, on behalf of the applications that invoke it. The module can then forward the responses of the subsystems to battery performance module 20, or ultimately across wireless network 42 to user manager module 40. Each resident application on wireless device can create an instance of this new software extension to communicate with the subsystems independently. It should be noted that the subsystems can include any data or data service operable on a wireless device, which embody the device's operational functionality.

In one non-limiting embodiment, such as in a CDMA protocol cellular telephone 12, processing subsystems 88 that may provide battery performance data 76 and/or associated data 78 may include an analog to digital converter ("ADC") component 91 that converts analog signals to digital signals during processing operations on the device, a diagnostic ("DIAG") component 93 that monitors and collects statistics on various other subsystems, a battery ("BAT") component 94 that manages the functionality associated with battery 16, a charger ("CHG") component 96 that manages the functionality associated with charging battery 16, and a call manager ("CM") component 98 that manages the transmission, receipt and processing of voice and/or data calls. Additional subsystems that may provide battery performance data 76 and/or associated data 78 include a receive ("Rx") component 100 for receiving communications sent to the processor of the wireless device, at least one call processing ("CP") component 102 and/or system determination ("SD") component 104 for handling the initiation, authentication, handoffs, data exchanges, messaging protocols, internal processing and decision-making, etc. associated with processing a message, and a transmit ("Tx") component 106 for sending communications from the processor of the wireless device, such as to handset components, wireless network 42, wireless network components, and other devices connected to the wireless network. In this embodiment, CP component 102 may handle the majority of the call processing tasks, while SD component 104 may handle tasks relating to selecting an appropriate system, from a plurality of systems, with which to communicate, as well as higher-level decision-making tasks referenced by CP component 102. Further, in this embodiment, additional processing subsystems 88 that may provide battery performance data 76 and/or associated data 78 may include a fax ("Fx") component 108 for handling facsimile communications, a multimedia ("MM") component 110 for managing the transmission, receipt and manipulation of photos and videos, and a messaging component ("MSG") 112 for text sending and receiving. It should be understood, however, that the described embodiments are not limited to subsystems having these names or functions, and may include any processing subsystem on the respective wireless device.

As described above, tracking/reporting configuration 62 may include one or more of selected battery parameter 26 that specifies which of the battery performance-related data available on the cellular device 12, 14, 15, 16, 17 to collect; selected associated data parameter 28 that specifies which of the corresponding environmental/operational condition information to collect; selected tracking parameter 30 that specifies how often to collect the data specified in the battery parameter 26 and associated data parameters 28; selected reporting parameters 32 that specifies when to report the collected battery performance data 76 and the associated data 78 to the remote battery performance module 21; selected test program 90 that includes a program or script for processing engine 84 or simulator module 22 to execute; and, selected test data 92 that includes data for processing engine 84 or simulator module 22 to use independently or while executing selected test program 90. It should be noted, however, that configuration 62 may be generated by any computer device connected to wireless network 22, or may be locally transmitted to the respective wireless device 12, 14, 16, 17, 18, such as by a manual input from a user, and/or through transmission from a locally-connected media reader.

Optionally, battery performance module 20 may include a simulator module 22 operable to operate any functionality of the respective wireless device 12, 14, 16, 17, 18. For example, simulator module 22 may execute selected test program 90, and may further execute selected test data 92. Selected test program 90 and/or selected test data 92 may include instructions or scripts for the simulator module 22 to operate any functionality of the respective wireless device 12, 14, 16, 17, 18, such as to transmit data using FTP, make a call for a specified period of time or until an event occurs, etc. So operable, the system allows for the simulator to function while the battery performance module 20 collects the data specified in configuration 62. For example, the simulator may conduct an actual call on the wireless device 12, 14, 16, 17, 18, during which the battery performance module records at a predetermined interval, such as every one-tenth (1/10) of a second, a predetermined battery performance parameter, such as the voltage of the battery, and optionally an associated parameter, such as the length of the call. This data may be used to troubleshoot both the operation of the battery and the battery related operation of transmitter on the wireless device 12, 14, 16, 17, 18.

Additionally, computer platform 13 may further include a communications module 85 embodied in hardware, firmware, software, and combinations thereof, that enables communications among the various components of the respective communications device, as well as between the device and network 42.

The respective wireless device further includes battery 16, which may be any form of battery or power supply, including but not limited to lithium-ion, solar, lithium-cadmium, fuel cell, and lead-acid. Battery 16 may be singular or may be multiple batteries. Battery 16 may include multiple independent sources of batteries. Battery 16 may be rechargeable, non-reusable, or some hybrid of the two. Battery 16 may include any source of power that permits the wireless device to operate.

Figure 3:
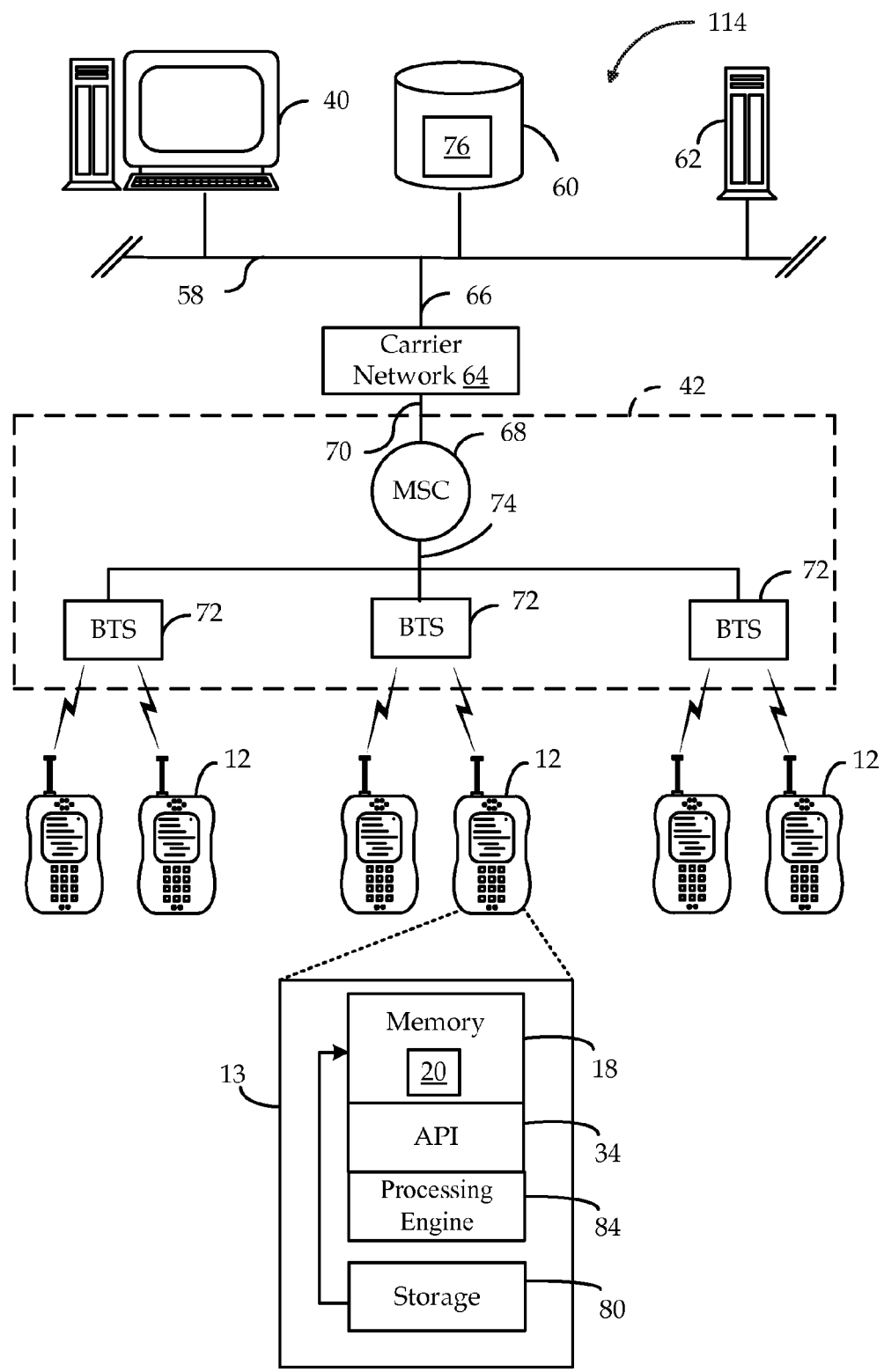
FIG. 3 is a schematic diagram of one embodiment of a cellular telephone network embodiment of the apparatus of FIG. 1, including one embodiment of a computer platform of the wireless device of FIG. 1.

Referring to FIG. 3, in a cellular telephone embodiment, for example, a cellular telephone system 114 may include wireless network 42 connected to a wired network 58 via a carrier network 64. The use of cellular telecommunication pathways has been increasing because wireless devices, such as the plurality of cellular telephones 12 illustrated in FIG. 3, are being manufactured with increased computing capabilities and are becoming tantamount to personal computers and hand-held personal digital assistants ("PDAs"), communicating packets including voice and data over wireless network 42. These "smart" cellular telephones 12 have APIs 34 on their local computer platform 13 that allow software developers to create software applications that operate on the cellular telephone, and control certain functionality on the device. FIG. 3 is a representative diagram that more fully illustrates the components of a cellular wireless network and the interrelation of the elements of one embodiment of the present system. Cellular wireless network 114 is merely exemplary and can include any system whereby remote modules, such as wireless devices 12, 14, 16, 17, 19, communicate over-the-air between and among each other and/or between and among components of a wireless network 42, including, without limitation, wireless network carriers and/or servers.

In system 114, user manager module 40 can be in communication over a LAN network 58 with a separate data repository 60 for storing battery performance data 76 gathered from the remote wireless devices 12, 14, 16, 17, 18, such as the respective data logs 74. Further, a data management server 62 may be in communication with user manager module 40 to provide post-processing capabilities, data flow control, etc. User manager module 40, data repository 60 and data management server 62 may be present on the cellular network 114 with any other network components that are needed to provide cellular telecommunication services. User manager module 40, and/or data management server 62 communicate with carrier network 64 through a data link 66, such as the Internet, a secure LAN, WAN, or other network. Carrier network 64 controls messages (generally being data packets) sent to a mobile switching center ("MSC") 68. Further, carrier network 64 communicates with MSC 68 by a network 70, such as the Internet, and/or POTS ("plain old telephone service"). Typically, in network 70, a network or Internet portion transfers data, and the POTS portion transfers voice information. MSC 68 may be connected to multiple base stations ("BTS") 72 by another network 74, such as a data network and/or Internet portion for data transfer and a POTS portion for voice information. BTS 72 ultimately broadcasts messages wirelessly to the wireless devices, such as cellular telephones 12, by short messaging service ("SMS"), or other over-the-air methods.

Referring to FIG. 3, each wireless device, such as cellular telephone 12 in this case, has computer platform 13 that can transmit data across wireless network 42, and that can receive and execute software applications and display data transmitted from user manager module 40 or another computer device connected to wireless network 42. Computer platform 13 also includes a processing engine 84, which may be an application-specific integrated circuit ("ASIC"), or other chipset, processor, logic circuit, or other data processing device. Processing engine 84 or other processor such as ASIC may execute an application programming interface ("API") layer 34 that interfaces with any resident programs, such as battery performance module 20, in a memory 18 of the wireless device. API 34 is a runtime environment executing on the respective wireless device. One such runtime environment is Binary Runtime Environment for Wireless® (BREW®) software developed by Qualcomm, Inc., of San Diego, Calif. Other runtime environments may be utilized that, for example, operate to control the execution of applications on wireless computing devices. Memory 18 may include read-only and/or random-access memory (RAM and ROM), EPROM, EEPROM, flash cards, or any memory common to computer platforms. Computer platform 13 also includes storage 80 that can hold the software applications, files, or data not actively used in memory 18, such as the software applications or data downloaded from user manager module 40. Storage 80 typically includes one or more flash memory cells, but can be any secondary or tertiary storage device, such as magnetic media, EPROM, EEPROM, optical media, tape, or soft or hard disk. Additionally, storage 80 can ultimately hold a resident copy of battery performance module 20 or agent, as is further described herein.

Figure 4:
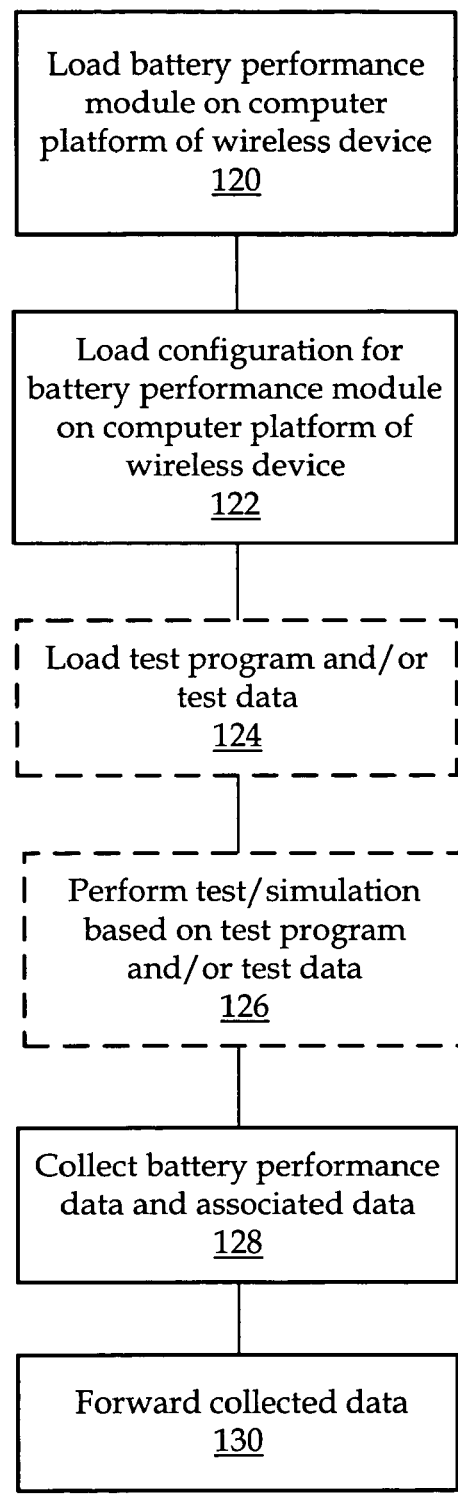
FIG. 4 is a flowchart of one embodiment of a method of performing battery performance measurement on a wireless device.

Referring to FIG. 4, one embodiment of a method for battery performance measurement on a wireless device includes loading at least a portion of a battery performance module 20 onto a computer platform 13 of a wireless device 12, 14, 16, 17, 18 (Block 120). For example, the battery performance module 20 may be embodied within the hardware and/or firmware of the wireless device during the manufacture of the device. Alternatively, the battery performance application may be "pushed" by a user manager module 40 to the wireless device 12, 14, 16, 17, 18, or "pulled" from a user manager module 40 by the wireless device 12, 14, 16, 17, 18, across a wireless network 42. Alternatively, the battery performance module 20 may be "pulled" or "pushed" depending on whether or not the wireless device 12, 14, 16, 17, 18 has the latest version of the battery performance module 20 for the respective wireless device 12, 14, 16, 17, 18. In another alternative, loading of the battery performance module 20 may be configurable in any manner, for example, being initiated by a predetermined event, such as a substandard talk time. In another alternative, the pushing or pulling of the battery performance module 20 to the wireless device 12, 14, 16, 17, 18 may be configurable in any manner, for example: being initiated by a predetermined event, such as the age of the battery 16 on the wireless device 12, 14, 16, 17, 18, or being initiated by an event such as a technician receiving a report of poor battery 16 performance by the user of the wireless device 12, 14, 16, 17, 18, or by the user of the wireless device 12, 14, 16, 17, 18.

Further, this embodiment of the method includes loading at least a portion of a configuration 62 for the battery performance module 20 on the computer platform 13 of the wireless device 12, 14, 16, 17, 18 (Block 122). For example, the configuration 62 may be embodied within the hardware and/or firmware of the wireless device during the manufacture of the device. Alternatively, the configuration 62 may be "pushed" by a user manager module 40 to the wireless device 12, 14, 16, 17, 18, or "pulled" from a user manager module 40 by the wireless device 12, 14, 16, 17, 18, across a wireless network 42. In another alternative, loading of the configuration 62 may be initiated in any manner, for example, being initiated by a predetermined event, such as a substandard talk time. In another alternative, the pushing or pulling of the configuration 62 to the wireless device 12, 14, 16, 17, 18 may be configurable in any manner, for example: being initiated by a predetermined event, such as the age of the battery 16 on the wireless device 12, 14, 16, 17, 18, or being initiated by an event such as a technician receiving a report of poor battery 16 performance by the user of the wireless device 12, 14, 16, 17, 18, or by the user of the wireless device 12, 14, 16, 17, 18.

Optionally, this embodiment of the method may include loading test programs and/or test data onto the respective wireless device (Block 124), and performing tests and/or simulations of predetermined battery performance based on the test programs and/or test data (Block 126). For example, configuration 62 may include selected test programs 90 and/or selected test data 92 that may be executed by processing engine 84 and/or simulator module 22 to generate the collected performance data 76 and associated data 78 as defined by configuration 62.

Further, this embodiment of the method includes collecting battery performance data 76 and associated data 78 from the processing engine 84 of the wireless device 12, 14, 16, 17, 18 in accordance with the configuration 62 (Block 128). For example, battery performance data 76 and associated data 78 retrieved from processing engine 84 of the wireless device during its operation may be stored in data log 74. In one embodiment, the configuration 62 contains test programs 90 for a simulator module 22 to execute, while battery performance data 76 and associated data 78 are retrieved from the processing engine 84. For example, test programs 90 may include such tests as performing a call or transmitting data using HTTP. The simulator module 22 would perform these tests while the battery performance module 20 collected battery performance data 76 and associated data 78.

Further, this embodiment of the method includes forwarding the collected battery performance data 76 and associated data 78 across the wireless network (Block 130). In one embodiment, the collected battery performance data 76 and associated data 78 is uploaded from the wireless device 12, 14, 16, 17, 18, 19 to user manager module 40 in accordance with the configuration 62, such as through a standard HTTP, an FTP, or some other data transfer protocol. In other embodiments, the collected battery performance data 76 and associated data 78 is uploaded from the wireless device using any communication means the wireless device 12, 14, 16, 17, 18 may access.

Figure 5:
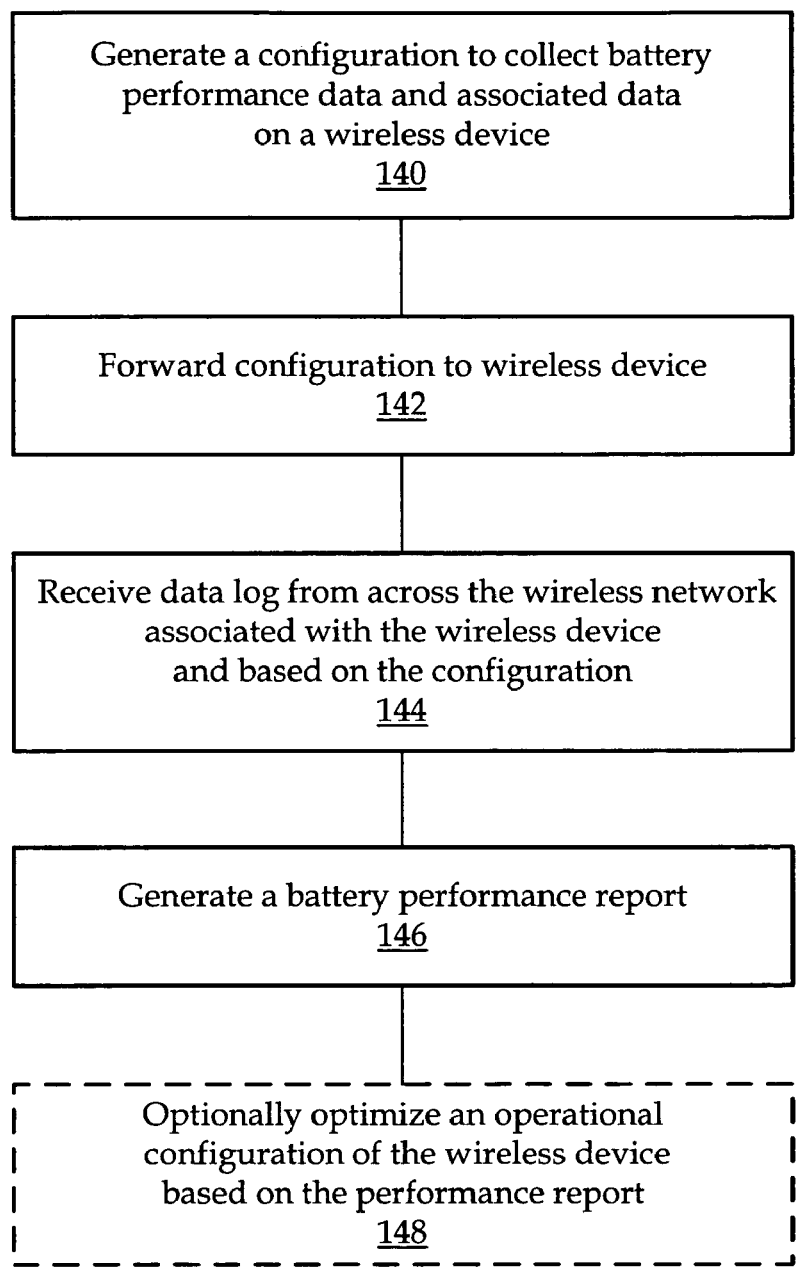
FIG. 5 is a flowchart of one embodiment of a method of monitoring battery performance in a wireless device.

Referring to FIG. 5, one embodiment of a method of monitoring battery performance in a wireless device includes generating a configuration 62 for a battery performance module 20 on a wireless device 12, 14, 16, 17, 18 based on user-defined battery standards 52 and predetermined battery standards 50 (Block 140). In one embodiment, both the user-defined battery standards 52 and the predetermined battery standards 50 include tests to be executed by a simulator module 22 on the wireless device 12, 14, 16, 17, 18. In one embodiment a technician sends a request, which may include user-defined battery standards 52, to a battery tracking configurator module 72, which then generates a configuration 62 and sends the configuration to a wireless device 12, 14, 16, 17, 18. Other means by which the configuration module 72 may be initiated include but are not limited to: predetermined events such as monthly checks of the wireless device 12, 14, 16, 17, 18, a network operator or technician, and the user of the wireless device 12, 14, 16, 17, 18.

Further, this embodiment of the method includes forwarding the configuration 62 to the respective wireless device 12, 14, 16, 17, 18 (Block 142). The configuration 62 may be forwarded by a user manager module 40 across a wireless network 42 to the respective wireless device 12, 14, 16, 17, 18. Alternatively, in another embodiment, the configuration 62 may be forwarded by the user manager module 40 by a static connection to the wireless device 12, 14, 16, 17, 18.

Further, this embodiment of the method includes receiving a data log 74 that includes battery performance data 76 and associated data 78 from the wireless device 12, 14, 16, 17, 18 that may correspond to a processing of the configuration 62 forwarded to the respective wireless device 12, 14, 16, 17, 18 (Block 144). In one embodiment, the user manager server 40 receives the data log 74 over a wireless network 42. The data log 74 may be received either as a whole or in pieces and assembled by the user manager module 40. In another embodiment, the user manager module 40 receives the data log 74 by a static connection to the wireless device 12, 14, 16, 17, 18.

Further, this embodiment of the method includes a performance analyzer 70 generating a battery performance report 60 based on the received data log 74 and one or more of the user-defined battery standards 52 and the predetermined battery standards 50 (Block 146). In one embodiment the battery performance report 60 is forwarded over the wireless network 42 to a wireless network help representative 23. The wireless network help representative 23 may take action based on the report, such as sending the user of the respective wireless device 12, 14, 16, 17, 18 a new battery or sending out requests for all of the batteries to be tested for this type of wireless device 12, 14, 16, 17, 18. In another embodiment, the battery performance report 60 is forwarded to the user of the respective wireless device 12, 14, 16, 17, 18.

Further, this embodiment of the method includes an optional step of an optimizer module 82 analyzing the battery performance report 60 and generating a new device operational configuration 68 for the respective wireless device 12, 14, 16, 17, 18 (Block 148). For example, new device operational configuration 68 is effective to change a setting on the wireless device which affects battery performance. Further, optimizer module 82 determines new device operational configuration 68 based on the collected battery performance data 76 and/or associated data 78. In one embodiment, the configuration 68 is then forwarded to the respective wireless device 12, 14, 16, 17, 18 for execution and changing of its operational battery performance-related parameters.

Alternatively, the user manager module 40 may reside on the wireless device 12, 14, 16, 17, 18. With the user manager module 40 so situated the forwarding and receiving of data and programs occurs within the computer platform 13 of the wireless device 12, 14, 16, 17, 18.

While the foregoing disclosure shows illustrative embodiments, it should be noted that various changes and modifications could be made herein without departing from the scope of the described embodiments as defined by the appended claims. Furthermore, although elements of the described embodiments may be described or claimed in the singular, the plural is contemplated unless limitation to the singular is explicitly stated.

What is claimed is:

1. An apparatus for determining performance of a battery, comprising:
    a battery performance module configured to generate a battery tracking configuration comprising a test program for execution by a wireless device, wherein the test program controls operation of a specified functionality on the wireless device while tracking battery performance data and corresponding associated data on the wireless device as identified by the battery tracking configuration, wherein the associated data comprises wireless device operational conditions during execution of the test program including information defining one or more applications operating on the wireless device;
    a data log configured to receive the battery performance data and the corresponding associated data logged by the wireless device during execution of the test program, wherein the battery performance data are indicative of a battery performance characteristic corresponding to the wireless device operational conditions during execution of the test program; and
    an optimization module operable configured to generate a new device operational configuration, according to an optimization algorithm, to optimize overall battery performance, wherein the new device operational configuration changes a setting on the wireless device and an operation of the one or more applications on the wireless device to change the battery performance based on the battery performance data and the corresponding associated data logged by the wireless device during execution of the test program;

wherein the battery performance data comprises at least one of a battery identification, a battery voltage, a battery current, a battery temperature, a charging status, a charging source, a charging voltage, a charging current or a charging time; and wherein the associated data comprises at least one parameter selected from the group consisting of a slot cycle index, a call time, an analog call, a digital call, a call protocol, a sleep/idle time, a transmit power, a display light duration, talk time, idle time and low power mode information;

wherein the specified functionality is selected from the group consisting of operating a user interface of the wireless device, transmitting or receiving a voice call, transmitting or receiving a data call, operating a position/location module, accessing the Internet, or running an application; and wherein the associated data comprises at least one parameter selected from the group consisting of a slot cycle index, a call time, an analog call, a digital call, a call protocol, a sleep/idle time, a transmit power, a display light duration, talk time, idle time and low power mode information.

2. The apparatus of claim 1, wherein the battery performance module is operable configured to transmit the battery tracking configuration across a wireless network to the wireless device.

3. The apparatus of claim 1, wherein the battery tracking configuration comprises at least one of a battery parameter, an associated data parameter, a tracking parameter, or a reporting parameter.

4. The apparatus of claim 1, wherein the battery tracking configuration further comprises test data to execute on the wireless device to cause the generation of at least a portion of the battery performance data.

5. The apparatus of claim 1, wherein the specified functionality on the wireless device comprises at least one of operating a user interface of the wireless device, transmitting or receiving a voice call, transmitting or receiving a data call, operating a position/location module, accessing the Internet, or running an application.

6. The apparatus of claim 1, wherein the battery performance module further comprises a performance analyzer and at least one of a user-defined battery performance standard or a predetermined battery performance standard, and wherein the performance analyzer is operable configured to compare the logged battery performance data to at least one of the user-defined battery performance standard or the predetermined battery performance standard to generate a battery performance characteristic.

7. The apparatus of claim 1, wherein the battery performance module is operable configured to transmit the data log across a wireless network to another entity for analysis.

8. The apparatus of claim 1, wherein the battery performance module further comprises a configurator module that sets the battery tracking configuration by allowing for a selection of the types of battery performance data to collect from a plurality of battery performance parameters.

9. The apparatus of claim 1, wherein the associated data further comprises wireless device processing subsystem data defining an operating wireless device functionality.

10. The apparatus of claim 1, wherein the wireless device operational conditions define an operational environment of the wireless device.

11. The apparatus of claim 1, wherein the wireless device operational conditions include information comprising timestamp information, currently-operating application information, and processing subsystem data defining an operating wireless device functionality.

12. The apparatus of claim 1, wherein the associated data further comprises information defining a call-related function operating on the wireless device, wherein the new device operational configuration is further effective to change another setting on the wireless device which changes operation of the call-related function on the wireless device that affects battery performance.

13. An apparatus for determining battery performance of a battery disposed on a wireless device, comprising:

means for generating a battery tracking configuration comprising a test program for execution by a wireless device, wherein the test program controls operation of a specified functionality on the wireless device while tracking battery performance data and corresponding associated data on the wireless device as identified by the battery tracking configuration, wherein the associated data comprises wireless device operational conditions during execution of the test program including information defining one or more applications operating on the wireless device;

means for receiving the battery performance data and corresponding associated data logged by the wireless device during execution of the test program, wherein the battery performance data are indicative of a battery performance characteristic corresponding to the wireless device operational conditions during execution of the test program; and means for generating a new operational configuration, according to an optimization algorithm, to optimize overall battery performance, wherein the new device operational configuration changes a setting on the wireless device and an operation of the one or more applications on the wireless device to change the battery performance based on the battery performance data and the corresponding associated data logged by the wireless device during execution of the test program;

wherein the battery performance data comprises at least one of a battery identification, a battery voltage, a battery current, a battery temperature, a charging status, a charging source, a charging voltage, a charging current or a charging time; and wherein the associated data comprises at least one parameter selected from the group consisting of a slot cycle index, a call time, an analog call, a digital call, a call protocol, a sleep/idle time, a transmit power, a display light duration, talk time, idle time and low power mode information.

14. A wireless device, comprising:

a computer platform having a battery performance module configured to: receive a battery tracking configuration comprising a test program for execution by the wireless device, wherein the test program controls operation of a specified functionality on the wireless device while tracking battery performance data and corresponding associated data as identified by the battery tracking configuration; execute the test program;

log the battery performance data and the corresponding associated data during execution of the test program, wherein the associated data comprises wireless device operational conditions during execution of the test program including information defining one or more applications operating on the wireless device;

forward the logged battery performance data and corresponding associated data for analysis; and receive a new device operational configuration, generated according to an optimization algorithm, to optimize overall battery performance, wherein the new device operational configuration changes a setting on the wireless device and an operation of the one or more applications on the wireless device to change the battery performance based on the battery performance data and the corresponding associated data logged by the wireless device during execution of the test program;

wherein the battery performance data comprises at least one of a battery identification, a battery voltage, a battery current, a battery temperature, a charging status, a charging source, a charging voltage, a charging current or a charging time; and wherein the associated data comprises at least one parameter selected from the group consisting of a slot cycle index, a call time, an analog call, a digital call, a call protocol, a sleep/idle time, a transmit power, a display light duration, talk time, idle time and low power mode information.

15. The device of claim 14, wherein the battery performance module is operable configured to receive the battery tracking configuration from across a wireless network.

16. The device of claim 14, wherein the battery performance module is operable configured to transmit the logged battery performance data across a wireless network.

17. The device of claim 14, wherein the battery tracking configuration comprises at least one of a battery parameter, an associated data parameter, a tracking parameter, or a reporting parameter.

18. The device of claim 17, wherein the battery tracking configuration further comprises test data executable to generate at least a portion of the battery performance data.

19. The device of claim 18, wherein the computer platform further comprises a test module operable configured to execute the test program and the test data to generate the battery performance data.

20. The device of claim 14, wherein the specified functionality comprises a functionality selected from the group consisting of operating a user interface of the wireless device, transmitting or receiving a voice call, transmitting or receiving a data call, operating a position/location module, accessing the Internet, and running an application.

21. The device of claim 14, further comprising a data log operable configured to store the logged battery performance data.

22. The device of claim 21, wherein the battery performance module is operable configured to selectively transmit the data log to another computer device across a wireless network.

23. The device of claim 14, wherein the associated data further comprises wireless device processing subsystem data defining an operating wireless device functionality.

24. The device of claim 14, wherein the wireless device operational conditions define an operational environment of the wireless device.

25. The device of claim 14, wherein the wireless device operational conditions include information comprising timestamp information, currently-operating application information, and processing subsystem data defining an operating wireless device functionality.

26. The device of claim 14, wherein the associated data further comprises information defining a call-related function operating on the wireless device, wherein the new device operational configuration is further effective to change another setting on the wireless device which changes operation of the call-related function on the wireless device that affects battery performance.

27. A wireless device, comprising:
means for receiving a battery tracking configuration comprising a test program for execution by the wireless device, wherein the test program controls operation of a specified functionality on the wireless device while tracking battery performance data and corresponding associated data as identified by the battery tracking configuration; means for executing the test program;

means for logging the battery performance data and the corresponding associated data during execution of the test program, wherein the associated data comprises wireless device operational conditions during execution of the test program including information defining one or more applications operating on the wireless device;

means for forwarding the logged battery performance data and corresponding associated data for analysis; and means for receiving a new device operational configuration, generated according to an optimization algorithm, to optimize overall battery performance, wherein the new device operational configuration changes a setting on the wireless device and an operation of the one or more applications on the wireless, device to change the battery performance based on the battery performance data and the corresponding associated data logged by the wireless device during execution of the test program;

wherein the battery performance data comprises at least one of a battery identification, a battery voltage, a battery current, a battery temperature, a charging status, a charging source, a charging voltage, a charging current or a charging time; and wherein the associated data comprises at least one parameter selected from the group consisting of a slot cycle index, a call time, an analog call, a digital call, a call protocol, a sleep/idle time, a transmit power, a display light duration, talk time, idle time and low power mode information.

28. A method of managing battery performance of a wireless device, comprising:
generating a battery tracking configuration comprising a test program executable by the wireless device, wherein the test program controls operation of a specified functionality on the wireless device while tracking battery performance data and corresponding associated data on the wireless device as identified by the battery tracking configuration, wherein the associated data comprises wireless device operational conditions during execution of the test program including information defining one or more applications operating on the wireless device;

receiving a data log comprising the battery performance data and the corresponding associated data logged by the wireless device during execution of the test program, wherein the battery performance data are indicative of a battery performance characteristic corresponding to the wireless device operational conditions during execution of the test program; and generating a new device operational configuration, according to an optimization algorithm, to optimize overall battery performance, wherein the new device operational configuration changes a setting on the wireless device and an operation of the one or more applications on the wireless device to change the battery performance based on the battery performance data and the corresponding associated data logged by the wireless device during execution of the test program;

wherein the battery performance data comprises at least one of a battery identification, a battery voltage, a battery current, a battery temperature, a charging status, a charging source, a charging voltage, a charging current or a charging time; and wherein the associated data comprises at least one parameter selected from the group consisting of a slot cycle index, a call time, an analog call, a digital call, a call protocol, a sleep/idle time, a transmit power, a display light duration, talk time, idle time and low power mode information.

29. The method of claim 28, wherein the battery tracking configuration comprises at least one of a battery performance parameter, an associated data parameter, a tracking parameter, a reporting parameter, or a test data.

30. The method of claim 28, where the specified functionality comprises a functionality selected from the group consisting of operating a user interface of the wireless device, transmitting or receiving a voice call, transmitting or receiving a data call, operating a position/location module, accessing the Internet, and running an application.

31. The method of claim 28, further comprising transmitting the battery tracking configuration to the wireless device across a wireless network.

32. The method of claim 31, wherein the wireless network comprises a cellular telephone network and wherein the wireless device comprises a cellular telephone.

33. The method of claim 28, wherein the associated data further comprises wireless device processing subsystem data defining an operating wireless device functionality.

34. The method of claim 28, wherein the wireless device operational conditions define an operational environment of the wireless device.

35. The method of claim 28, wherein the wireless device operational conditions include information comprising timestamp information, currently-operating application information, and processing subsystem data defining an operating wireless device functionality.

36. The method of claim 28, wherein the associated data further comprises information defining a call-related function operating on the wireless device, wherein the new device operational configuration is further effective to change another setting on the wireless device which changes operation of the call-related function on the wireless device that affects battery performance.

37. A method of managing battery performance of a wireless device, comprising:

receiving a battery performance tracking configuration comprising a test program for execution by the wireless device, wherein the test program controls operation of a specified functionality on the wireless device while tracking battery performance data and corresponding associated data as identified by the battery tracking configuration; executing the test program;

logging the battery performance data and the corresponding associated data during execution of the test program, wherein the associated data comprises wireless device operational conditions during execution of the test program including information defining one or more applications operating on the wireless device;

forwarding the logged battery performance data and corresponding associated data for analysis; and receiving a new device operational configuration, generated according to an optimization algorithm, to optimize overall battery performance, wherein the new device operational configuration changes a setting on the wireless device and an operation of the one or more applications on the wireless device to change the battery performance based on the battery performance data and the corresponding associated data logged by the wireless device during execution of the test program;

wherein the battery performance tracking configuration defines a type of battery performance parameter to log, where the battery performance parameter is selected from the group consisting of a battery voltage, a battery current, a battery temperature, a charging status, a charging source, a charging voltage, a charging current and a charging time; and wherein the associated data comprises at least one parameter selected from the group consisting of a slot cycle index, a call time, an analog call, a digital call, a call protocol, a sleep/idle time, a transmit power, a display light duration, talk time, idle time and low power mode information.

38. The method of claim 37, further comprising receiving the battery performance tracking configuration over a wireless network.

39. The method of claim 37, further comprising executing the test program to transmit or receive a call.

40. The method of claim 37, wherein the specified functionality comprises at least one of operating a user interface of the wireless device, transmitting or receiving a voice call, transmitting or receiving a data call, operating a position/location module, accessing the Internet, or running an application.

41. The method of claim 37, where forwarding further comprises transmitting across a wireless communications network.

42. The method of claim 41, where the wireless communications network comprises a cellular telephone network, and where the wireless device comprises a cellular telephone.

43. The method of claim 37, wherein the associated data further comprises wireless device processing subsystem data defining an operating wireless device functionality.

44. The method of claim 37, wherein the wireless device operational conditions define an operational environment of the wireless device.

45. The method of claim 37, wherein the wireless device operational conditions include information comprising timestamp information, currently-operating application information, and processing subsystem data defining an operating wireless device functionality.

46. The method of claim 37, wherein the associated data further comprises information defining a call-related function operating on the wireless device, wherein the new device operational configuration is further effective to change another setting on the wireless device which changes operation of the call-related function on the wireless device that affects battery performance.

47. A non-transitory computer readable medium containing a computer program that, when executed, directs a computer device to perform the actions of:

generating a battery tracking configuration comprising a test program executable by the wireless device, wherein the test program controls operation of a specified functionality on the wireless device while tracking battery performance data and corresponding associated data on the wireless device as identified by the battery tracking configuration, wherein the associated data comprises wireless device operational during execution of the test program including information defining one or more applications operating on the wireless device;

receiving a data log comprising the battery performance data and the corresponding associated data logged by the wireless device during execution of the test program, wherein the battery performance data are indicative of a battery performance characteristic corresponding to the wireless device operational conditions during execution of the test program; and generating a new device operational configuration, according to an optimization algorithm, to optimize overall battery performance, wherein the new device operational configuration changes a setting on the wireless device and an operation of the one or more applications on the wireless device to change the battery performance based on the battery performance data and the corresponding associated data logged by the wireless device during execution of the test program;

wherein the battery performance data comprises at least one of a battery identification, a battery voltage, a battery current, a battery temperature, a charging status, a charging source, a charging voltage, a charging current or a charging time; and wherein the associated data comprises at least one parameter selected from the group consisting of a slot cycle index, a call time, an analog call, a digital call, a call protocol, a sleep/idle time, a transmit power, a display light duration, talk time, idle time and low power mode information.

48. A non-transitory computer readable medium containing a computer program that, when executed, directs a wireless device to perform the actions of:

receiving a battery performance tracking configuration comprising a test program for execution by the wireless device, wherein the test program controls operation of a specified functionality on the wireless device while tracking battery performance data and corresponding associated data as identified by the battery tracking configuration; executing the test program;

logging the battery performance data and the corresponding associated data during execution of the test program, wherein the associated data comprises wireless device operational conditions during execution of the test program including information defining one or more applications operating on the wireless device; forwarding the logged battery performance data and corresponding associated data for analysis; and receiving a new device operational configuration, generated according to an optimization algorithm, to optimize overall battery performance, wherein the new device operational configuration changes a setting on the wireless device and an operation of the one or more applications on the wireless device to change the battery performance based on the battery performance data and the corresponding associated data logged by the wireless device during execution of the test program wherein the battery performance data comprises at least one of a battery identification, a battery voltage, a battery current, a battery temperature, a charging status, a charging source, a charging voltage, a charging current or a charging time; and wherein the associated data comprises at least one parameter selected from the group consisting of a slot cycle index, a call time, an analog call, a digital call, a call protocol, a sleep/idle time, a transmit power, a display light duration, talk time, idle time and low power mode information.

49. At least one processor configured to perform the actions of:

generating a battery tracking configuration comprising a test program executable by the wireless device, wherein the test program controls operation of a specified functionality on the wireless device while tracking battery performance data and corresponding associated data on the wireless device as identified by the battery tracking configuration, wherein the associated data comprises wireless device operational conditions during execution of the test program including information defining one or more applications operating on the wireless device;

receiving a data log comprising the battery performance data and the corresponding associated data logged by the wireless device during execution of the test program, wherein the battery performance data are indicative of a battery performance characteristic corresponding to the wireless device operational conditions during execution of the test program; and generating a new device operational configuration, according to an optimization algorithm, to optimize overall battery performance, wherein the new device operational configuration changes a setting on the wireless device and an operation of the one or more applications on the wireless device to change the battery performance based on the battery performance data and the corresponding associated data logged by the wireless device during execution of the test program;

wherein the battery performance data comprises at least one of a battery identification, a battery voltage, a battery current, a battery temperature, a charging status, a charging source, a charging voltage, a charging current or a charging time; and wherein the associated data comprises at least one parameter selected from the group consisting of a slot cycle index, a call time, an analog call, a digital call, a call protocol, a sleep/idle time, a transmit power, a display light duration, talk time, idle time and low power mode information.

50. At least one processor configured to perform the actions of:

receiving a battery performance tracking configuration comprising a test program for execution by the wireless device, wherein the test program controls operation of a specified functionality on the wireless device while tracking battery performance data and corresponding associated data as identified by the batten' tracking configuration; executing the test program;

logging the battery performance data and the corresponding associated data during execution of the test program, wherein the associated data comprises wireless device operational conditions during execution of the test program including information defining one or more applications operating on the wireless device;

forwarding the logged battery performance data and corresponding associated data for analysis; and receiving a new device operational configuration, generated according to an optimization algorithm, to optimize overall battery performance, wherein the new device operational configuration changes a setting on the wireless device and an operation of the one or more applications on the wireless device to change the battery performance based on the battery performance data and the corresponding associated data logged by the wireless device during execution of the test program;

wherein the battery performance data comprises at least one of a battery identification, a battery voltage, a battery current, a battery temperature, a charging status, a charging source, a charging voltage, a charging current or a charging time; and wherein the associated data comprises at least one parameter selected from the group consisting of a slot cycle index, a call time, an analog call, a digital call, a call protocol, a sleep/idle time, a transmit power, a display light duration, talk time, idle time and low power mode information.

* * * * *